United States Patent
Torimoto et al.

(10) Patent No.: US 11,101,413 B2
(45) Date of Patent: Aug. 24, 2021

(54) SEMICONDUCTOR NANOPARTICLES, METHOD OF PRODUCING THE SEMICONDUCTOR NANOPARTICLES, AND LIGHT-EMITTING DEVICE

(71) Applicants: National University Corporation Tokai National Higher Education and Research System, Nagoya (JP); OSAKA UNIVERSITY, Suita (JP); NICHIA CORPORATION, Anan (JP)

(72) Inventors: Tsukasa Torimoto, Nagoya (JP); Tatsuya Kameyama, Nagoya (JP); Marino Kishi, Iwakura (JP); Chie Miyamae, Nagoya (JP); Susumu Kuwabata, Ibaraki (JP); Taro Uematsu, Suita (JP); Daisuke Oyamatsu, Tokushima (JP); Kenta Niki, Anan (JP)

(73) Assignees: NATIONAL UNIVERSITY CORPORATION TOKAI NATIONAL, Nagoya (JP); OSAKA UNIVERSITY, Osaka (JP); NICHIA CORPORATION, Anan (JP)

(*) Notice: Subject to any disclaimer, the term of this patent is extended or adjusted under 35 U.S.C. 154(b) by 63 days.

(21) Appl. No.: 16/489,214

(22) PCT Filed: Feb. 28, 2018

(86) PCT No.: PCT/JP2018/007580
§ 371 (c)(1),
(2) Date: Aug. 27, 2019

(87) PCT Pub. No.: WO2018/159699
PCT Pub. Date: Sep. 7, 2018

(65) Prior Publication Data
US 2020/0006601 A1 Jan. 2, 2020

(30) Foreign Application Priority Data

Feb. 28, 2017 (JP) .............................. JP2017-037477
Feb. 15, 2018 (JP) .............................. JP2018-025251

(51) Int. Cl.
*H01L 33/50* (2010.01)
*C09K 11/62* (2006.01)
(Continued)

(52) U.S. Cl.
CPC ............ *H01L 33/502* (2013.01); *C09K 11/62* (2013.01); *H01L 33/005* (2013.01); *H01L 33/06* (2013.01); *H01L 33/507* (2013.01)

(58) Field of Classification Search
CPC ..... H01L 33/502; H01L 33/005; H01L 33/06; H01L 33/507; H01L 33/504; H01L 33/32;
(Continued)

(56) References Cited

U.S. PATENT DOCUMENTS

2010/0193806 A1   8/2010   Byun
2017/0022413 A1   1/2017   Torimoto et al.

FOREIGN PATENT DOCUMENTS

CN   102212363 B   11/2013
JP   2010177656 A   8/2010
(Continued)

OTHER PUBLICATIONS

Kuwabata, S., et al., "Synthesis of New Fluorescent Semiconductor Nanoparticles and Their Optical Uses", ECS Transactions, The Electrochemical Society, vol. 45, No. 5, pp. 131-137, (2012), 7 pages.

*Primary Examiner* — Allen L Parker
*Assistant Examiner* — Wasiul Haider
(74) *Attorney, Agent, or Firm* — Hunton Andrews Kurth LLP (57) ABSTRACT

Semiconductor nanoparticles including Ag, In, Ga, and S are provided. In the semiconductor nanoparticles, a ratio of a
(Continued)

number of Ga atoms to a total number of In and Ga atoms is 0.95 or less. The semiconductor nanoparticles emit light having an emission peak with a wavelength in a range of from 500 nm to less than 590 nm, and a half bandwidth of 70 nm or less, and have an average particle diameter of 10 nm or less.

18 Claims, 4 Drawing Sheets

(51) Int. Cl.
  *H01L 33/00* (2010.01)
  *H01L 33/06* (2010.01)
(58) Field of Classification Search
  CPC ... C09K 11/62; C09K 11/621; C01P 2004/64; C01P 2002/72; C01P 2004/80; C01G 15/006; B82Y 30/00; B82Y 40/00
  See application file for complete search history.

(56) References Cited

FOREIGN PATENT DOCUMENTS

| | | |
|---|---|---|
| JP | 2012212862 A | 11/2012 |
| JP | 2017014476 A | 1/2017 |
| JP | 2017025201 A | 2/2017 |

SEMICONDUCTOR NANOPARTICLES, METHOD OF PRODUCING THE SEMICONDUCTOR NANOPARTICLES, AND LIGHT-EMITTING DEVICE

CROSS-REFERENCE TO RELATED APPLICATIONS

This is a national phase application based on International Patent Application No. PCT/JP2018/007580 filed Feb. 28, 2018, claiming priority to Japanese Patent Application No. 2017-037477 filed Feb. 28, 2017 and Japanese Patent Application No. 2018-025251 filed Feb. 15, 2018, the entire contents of which all are incorporated herein by reference.

BACKGROUND

Technical Field

The present invention relates to semiconductor nanoparticles, a method of producing the semiconductor nanoparticles, and a light-emitting device.

Description of the Related Art

Semiconductor particles with a particle diameter of, for example, 10 nm or less are known to exhibit a quantum size effect, and such nanoparticles are referred to as "quantum dots" (also referred to as "semiconductor quantum dots"). The quantum size effect is a phenomenon where a valence band and a conduction band, each of which is regarded as continuous in bulk particles, become discrete in nanoparticles, and the bandgap energy varies in accordance with their particle diameter.

Quantum dots can absorb light and change the wavelength of the light corresponding to the bandgap energy. Thus, white light-emitting devices using quantum dots are proposed (e.g., refer to Japanese Unexamined Patent Application Publications No. 2012-212862 and No. 2010-177656). More specifically, light emitted from a light-emitting diode (LED) chip is partially absorbed by quantum dots, and the emission from the quantum dots and the light from the LED chip are mixed to produce white light. In these patent application documents, use of binary quantum dots of Group 12-Group 16 materials, such as CdSe or CdTe, or Group 14-Group 16 materials, such as PbS or PbSe, is proposed. Also, as ternary semiconductor nanoparticles that exhibit a band edge emission and that can have a composition with low toxicity, tellurium compound nanoparticles (e.g., Japanese Patent Application Publication No. 2017-014476) and sulfide nanoparticles (e.g., Japanese Patent Application Publication No. 2017-025201) are proposed.

SUMMARY

Problems to be Solved by the Invention

However, the semiconductor nanoparticles described in Japanese Patent Application Publications No. 2017-014476 and No. 2017-025201 have a peak emission wavelength at relatively long wavelengths. Thus, an aspect of the present invention is directed to semiconductor nanoparticles that exhibit a band edge emission, and have a peak emission wavelength at short wavelengths.

Means for Solving the Problem

A first aspect is directed to semiconductor nanoparticles containing Ag, In, Ga, and S, in which the ratio of the number of Ga atoms to the total number of In and Ga atoms is from 0.95 or less, emitting light having an emission peak with a wavelength in a range of from 500 nm to less than 590 nm and a half bandwidth of 70 nm or less upon irradiation with light, and having an average particle diameter of 10 nm or less.

A second aspect is directed to a method of producing semiconductor nanoparticles including preparing a mixture containing silver acetate, indium acetylacetonate, gallium acetylacetonate, a sulfur source, and an organic solvent; and heat-treating the mixture.

A third aspect is directed to a light-emitting device including a light conversion member containing the semiconductor nanoparticles, and a semiconductor light-emitting element.

Effect of the Invention

An aspect of the present invention may provide semiconductor nanoparticles that exhibit a band edge emission, and have a peak emission wavelength at short wavelengths.

DETAILED DESCRIPTION

Embodiments according to the present invention will now be described. However, the embodiments described below are examples of the semiconductor nanoparticles, the method of producing the semiconductor nanoparticles, and the light-emitting device for embodying the technical concept of the present invention, and the present invention is not limited to the semiconductor nanoparticles, the production method, and the light-emitting device described below. As used herein, the term "step" means not only an independent step but also a step which cannot be clearly distinguished from the other steps but that can achieve the intended object. For the amount of each component contained in a composition, when a plurality of substances corresponding to the component are present in the composition, the amount of the component means the total amount of the corresponding substances present in the composition unless otherwise specified.

Semiconductor Nanoparticles

The semiconductor nanoparticles, which is a first embodiment, contains silver (Ag), indium (In), gallium (Ga), and sulfur (S). The semiconductor nanoparticles have a ratio of the number of Ga atoms to the total number of In and Ga atoms (Ga/(Ga+ In)) of 0.95 or less. The semiconductor nanoparticles emit light having a peak emission with a wavelength in the range of from 500 nm to less than 590 nm, and a spectral half bandwidth of 70 nm or less upon irradiation with light. The semiconductor nanoparticles have an average particle diameter of 10 nm or less.

The semiconductor nanoparticles containing Ag, In, Ga, and S, and having a ratio of the number of Ga atoms to the total number of In and Ga atoms in the predetermined range exhibit a band edge emission having a peak emission in the range of from 500 nm to less than 590 nm, which is a longer wavelength than excitation light, and is in the visible region.

The semiconductor nanoparticles may have at least one crystal structure selected from the group consisting of tetragonal crystal, hexagonal crystal, and orthorhombic crystal. Semiconductor nanoparticles containing Ag, In, and S, and having a tetragonal, hexagonal, or orthorhombic crystal structure are typically described in, for example, literature as represented by the composition formula: $AgInS_2$. Semiconductor nanoparticles according to the present embodiment may be regarded as the semiconductor nanoparticles where, for example, In, which is a Group 13 element, is partially substituted by Ga, which is another Group 13 element. In other words, the semiconductor nanoparticles have a composition represented by, for example, Ag—I—Ga—S or $Ag(In, Ga)S_2$.

The semiconductor nanoparticles represented by, for example, the composition formula: Ag—In—Ga—Se with a hexagonal crystal structure is wurtzite, and those with a tetragonal crystal structure is chalcopyrite. The crystal structure of the semiconductor nanoparticles is identified by, for example, measuring the XRD pattern obtained through X-ray diffraction (XRD) analysis. Specifically, the XRD pattern obtained from the semiconductor nanoparticles is compared with known XRD patterns of semiconductor nanoparticles represented by the composition: $AgInSe_2$ or with the XRD patterns obtained through simulations using the crystal structure parameters. If the pattern of the semiconductor nanoparticles coincides with a pattern among the known patterns and the simulated patterns, the semiconductor nanoparticles have a crystal structure of the coincided pattern.

An aggregate of the semiconductor nanoparticles may be a mix of the semiconductor nanoparticles with different crystal structures. In this case, peaks attributable to a plurality of crystal structures are observed in the XRD pattern.

The semiconductor nanoparticles may be essentially composed of Ag, In, Ga, and S. The term "essentially" is used herein on the understanding that elements other than Ag, In, Ga, Se, and S and attributable to, for example, mixed-in impurities can unavoidably be contained.

The ratio of the number of Ga atoms to the total number of In and Ga atoms, or Ga/(Ga+ In), (hereinafter also referred to as "Ga ratio") may be 0.95 or less, and more preferably from 0.2 to 0.9.

The ratio of the number of Ag atoms to the total number of Ag, In, and Ga atoms, or Ag/(Ag+ In+Ga), (hereinafter also referred to as "Ag ratio") may be from 0.05 to 0.55.

Ag ratio can be from 0.3 to 0.55, and Ga ratio may be from 0.5 to 0.9, and preferably Ag ratio may be from 0.35 to 0.53, and Ga ratio can be from 0.52 to 0.86.

Ga ratio may be from 0.2 to 0.9, and Ga ratio+2× Ag ratio may be from 1.2 to 1.7, and preferably Ga ratio may be from 0.2 to 0.9, Ag ratio may be from 0.3 to 0.55, and Ga ratio+2× Ag ratio may be from 1.2 to 1.7.

Ag ratio may be from 0.05 to 0.27, and Ga ratio may be from 0.25 to 0.75. Preferably Ag ratio may be from 0.06 to 0.27, and Ga ratio may be from 0.26 to 0.73.

Ga ratio may be from 0.2 to 0.8, and Ga ratio+2× Ag ratio may be from 0.6 to 1, and preferably Ga ratio may be from 0.2 to 0.8, Ag ratio may be from 0.05 to 0.4, and Ga ratio+2× Ag ratio may be from 0.6 to 1.

The ratio of the number of S atoms to the total number of Ag, In, and Ga atoms, or S/(Ag+ In+Ga), (hereinafter also referred to as "S ratio") may be, for example, from 0.6 to 1.6.

The composition of the semiconductor nanoparticles may be identified by using, for example, X-ray fluorescence (XRF) analysis. Ga ratio or Ga/(Ga+ In), Ag ratio or Ag/(Ag+ In+Ga), and S ratio or S/(Ag+ In+Ga) are calculated based on the composition determined by this method.

The semiconductor nanoparticles have an average particle diameter of 10 nm or less. The average particle diameter may be, for example, less than 10 nm, and preferably 5 nm or less. With an average particle diameter exceeding 10 nm, the quantum size effect cannot be easily obtained, and the band edge emission cannot be easily exhibited. The lower limit of the average particle diameter is, for example, 1 nm.

The particle diameter of the semiconductor nanoparticles can be determined from, for example, a TEM image captured using a transmission electron microscope (TEM). Specifically, the particle diameter of a particle observed in a TEM image is defined as the length of the longest line segment among the line segments connecting two points on the circumference of the particle and passing through the particle.

However, for a rod-shaped particle, the length of the short axis is defined as the particle diameter. A rod-shaped particle is a particle having a short axis and a long axis orthogonal to the short axis, and the ratio of the long axis to the short axis is greater than 1.2 in a TEM image. Examples of the rod-shaped particles include tetragonal (including rectangular), elliptical, and polygonal particles observed in an TEM image. The rod-shaped particles may have, for example, a circular, elliptical, or polygonal cross-section, which is a plane orthogonal to the long axis. Specifically, for a rod-shaped particle with an elliptical cross-section, the length of the long axis is the longest line segment among the line segments connecting two points on the circumference of the particle. For a rod-shaped particle with a rectangular or polygonal cross-section, the length of the long axis is the longest line segment among the line segments parallel to the longest side among the sides defining the perimeter and connecting two points on the perimeter of the particle. The length of the short axis is the longest line segment among the line segments connecting two points on the perimeter of the particle, and orthogonal to the line segment defining the length of the long axis.

The average particle diameter of the semiconductor nanoparticles is determined by measuring the particle diameters of all the measurable particles observed in a TEM image captured with 50,000 to 150,000× magnification, and averaging the particle diameters. The term "measurable" particles as used herein refers to particles whose entire images are observable in a TEM image. Thus, in a TEM image, particles partially not in the captured site and observed as partially cut-out particles are not measurable. When a TEM image contains 100 or more measurable particles, their average particle diameter is obtained using the single TEM image. When a TEM image contains less than 100 measurable particles, another TEM image is captured in a different site of the particles, and an average particle diameter is obtained by measuring and averaging the particle diameters of 100 or more measurable particles using the two or more TEM images.

The semiconductor nanoparticles containing Ag, In, Ga, and S, and having the ratio of the number of Ga atoms to the total number of In and Ga atoms in a predetermined range may exhibit a band edge emission. The semiconductor nanoparticles emit light with a peak emission wavelength in the range of from 500 nm to less than 590 nm upon irradiation of light having a peak around 365 nm. The peak emission wavelength may be, for example, from 500 nm to 580 nm, from 500 nm to 575 nm, or from 505 nm to less than 575, or, from 570 nm to 585 nm or from 575 nm to 580 nm. The peak emission may have a spectral half bandwidth of, for example, 70 nm or less, 60 nm or less, 55 nm or less, or 50 nm or less. The lower limit of the half bandwidth may be, for example, 10 nm or more, or 20 nm or more.

The semiconductor nanoparticles may show other emissions, for example, defect emission as well as band edge emission. A typical defect emission has a long emission lifetime and a broad spectrum, and has a peak at longer wavelengths than band edge emission. When both band edge emission and defect emission are exhibited, the intensity of the band edge emission is preferably greater than the intensity of the defect emission.

The semiconductor nanoparticles may exhibit a band edge emission with a peak appearing in a different position by changing the shape and/or the average particle diameter, in particular the average particle diameter. For example, the semiconductor nanoparticles having a smaller average particle diameter have greater band gap energy because of the quantum size effect, and thus may exhibit a band edge emission with a peak wavelength shifted at shorter wavelengths.

The semiconductor nanoparticles may exhibit a band edge emission with a peak appearing in a different position by changing the composition of the semiconductor nanoparticles. For example, with a greater Ga ratio, the semiconductor nanoparticles may exhibit a band edge emission with a peak wavelength shifted at shorter wavelengths.

The semiconductor nanoparticles preferably show an absorption spectrum with an exciton peak. An exciton peak is a peak resulting from exciton formation. Thus, the semiconductor nanoparticles with an exciton peak appearing in the absorption spectrum are suitable for a band edge emission with a small particle diameter distribution, and less crystal defect. The semiconductor nanoparticles having a sharper exciton peak contain more particles with a uniform particle diameter and less crystal defect in its aggregate of the particles. Thus, a sharp exciton peak seemingly indicates a narrower emission half bandwidth, and improved emission efficiency. The semiconductor nanoparticles according to the present embodiment show an absorption spectrum with an exciton peak in the range of, for example, from 450 nm to less than 590 nm.

The semiconductor nanoparticles may have its surface modified with a surface modifier. A surface modifier, for example, stabilizes the semiconductor nanoparticles to prevent aggregation or growth of the particles, and/or improves dispersibility of the particles in a solvent.

Examples of the surface modifier include nitrogen-containing compounds having a hydrocarbon group with a carbon number of from 4 to 20, sulfur-containing compounds having a hydrocarbon group with a carbon number of from 4 to 20, and oxygen-containing compounds having a hydrocarbon group with a carbon number of from 4 to 20. Examples of the hydrocarbon group with a carbon number of from 4 to 20 include saturated aliphatic hydrocarbon groups, such as n-butyl, isobutyl, n-pentyl, n-hexyl, octyl, decyl, dodecyl, hexadecyl, and octadecyl; unsaturated aliphatic hydrocarbon groups, such as oleyl; alicyclic hydrocarbon groups, such as cyclopentyl and cyclohexyl; and aromatic hydrocarbon groups, such as phenyl, benzyl, naphthyl, and naphthylmethyl. Of these, saturated aliphatic hydrocarbon groups and unsaturated aliphatic hydrocarbon groups are preferable. Examples of the nitrogen-containing compounds include amines and amides. Examples of the sulfur-containing compound include thiols. Examples of the oxygen-containing compound include fatty acids.

Preferably, the surface modifier is a nitrogen-containing compound having a hydrocarbon group with a carbon number of from 4 to 20. Examples of such nitrogen-containing compound include alkylamines, such as n-butylamine, isobutylamine, n-pentylamine, n-hexylamine, octylamine, decylamine, dodecylamine, hexadecylamine, and octadecylamine, and alkenyl amines, such as oleylamine.

Also preferably, the surface modifier is a sulfur-containing compound having a hydrocarbon group with a carbon number of from 4 to 20. Examples of such sulfur-containing compounds include alkyl thiols, such as n-butane thiol, isobutane thiol, n-pentane thiol, n-hexane thiol, octane thiol, decane thiol, dodecane thiol, hexadecane thiol, and octadecane thiol.

Two or more different surface modifiers may be used in combination. For example, a single compound selected from the above examples of the nitrogen-containing compound (e.g., oleylamine) and a single compound selected from the above examples of the sulfur-containing compound (e.g., dodecane thiol) may be used in combination.

Method of Producing Semiconductor Nanoparticles

The method of producing semiconductor nanoparticles according to a second embodiment includes preparing a mixture containing a salt of silver, a salt of indium, a salt of gallium, a source of sulfur, and an organic solvent, and heat-treating the prepared mixture. Preferably, a mixture containing silver acetate, indium acetylacetonate, gallium acetylacetonate, sulfur or thiourea serving as a sulfur source, and an organic solvent is prepared.

The mixture can be prepared by adding a salt of silver, a salt of indium, a salt of gallium, and a source of sulfur to an organic solvent, and mixing them. The ratio of Ag, In, Ga, and S in the mixture is selected as appropriate in accordance with the target composition. For example, the molar ratio of Ga to the total molar amount of In and Ga is from 0.2 to 0.9. Also, for example, the molar ratio of Ag to the total molar amount of Ag, In, and Ga is from 0.05 to 0.55. Also, for example, the molar ratio of S to the total molar amount of Ag, In, and Ga is from 0.6 to 1.6.

Examples of the organic solvent include amines having a hydrocarbon group with a carbon number of from 4 to 20, in particular, alkylamine or alkenylamine with a carbon number of from 4 to 20, thiols having a hydrocarbon group with a carbon number of from 4 to 20, in particular, alkylthiol or alkenylthiol with a carbon number of from 4 to 20, and phosphines having a hydrocarbon group with a carbon number of from 4 to 20, in particular, alkylphosphine or alkenylphosphine with a carbon number of from 4 to 20. These organic solvents can eventually surface-modify the resulting semiconductor nanoparticles. The organic solvent may be formed from two or more of these organic solvents in combination. In particular, a mixed solvent containing at least one selected from thiols having a hydrocarbon group with a carbon number of from 4 to 20, and at least one selected from amines having a hydrocarbon group with a carbon number of from 4 to 20 may be used in combination. These organic solvents may also be mixed with other organic solvents.

In the method of producing semiconductor nanoparticles, the mixture is heat-treated to produce semiconductor nanoparticles in an organic solvent. The temperature at which the mixture is heat-treated is, for example, from 230° C. to 310° C., preferably above 260° C. to 310° C., and more preferably from 290° C. to 310° C. The duration of the heat treatment is, for example, from 5 minutes to 20 minutes, and preferably from 5 minutes to 15 minutes. The mixture may be heat-treated at two or more different temperatures. For example, the mixture may be heat-treated at a temperature of from 30° C. to 155° C. for from 1 min to 15 min, and then at a temperature of from 230° C. to 310° C. for from 5 min to 20 min.

The heat treatment atmosphere is an inert atmosphere, and particularly preferably an argon atmosphere or a nitrogen atmosphere. An inert atmosphere can reduce or prevent production of an oxide, or a by-product, and oxidation of the surface of the semiconductor nanoparticles.

Upon completion of the production of the semiconductor nanoparticles, the resultant semiconductor nanoparticles may be separated from the organic solvent, which has undergone treatment, and may be further purified as appropriate. The separation after the production may be carried out, for example, by centrifuging the organic solvent containing the nanoparticles, and collecting the supernatant liquid containing the nanoparticles. The purification may be carried out by, for example, adding an organic solvent to the supernatant liquid, centrifuging the mixture, and collecting the precipitate, or the semiconductor nanoparticles. The semiconductor nanoparticles may also be collected by vaporizing the supernatant liquid. The collected precipitate may be dried, for example, through vacuum deairing or natural drying, or a combination of vacuum deairing and natural drying. Natural drying may be carried out, for example, by leaving the precipitate as it is in atmospheric air at normal temperature and at normal pressure for 20 hours or more, for example, about 30 hours.

The collected precipitate may be dispersed in an organic solvent. The purification (addition of alcohol and centrifugation) may be repeated multiple times as appropriate. The alcohol to be used for purification may be a lower alcohol with a carbon number of 1 to 4, such as methanol, ethanol, or n-propyl alcohol. When the precipitate is dispersed in an organic solvent, for example, a halogen solvent, such as chloroform, or a hydrocarbon solvent, such as toluene, cyclohexane, hexane, pentane, or octane, may be used as the organic solvent.

Core-Shell Semiconductor Nanoparticles

The semiconductor nanoparticles may be core-shell semiconductor nanoparticles including a core selected from at least one of the semiconductor nanoparticles according to the first embodiment and the semiconductor nanoparticles produced by the method according to the second embodiment, and a shell forming a heterojunction with the core, and having a greater band gap energy than the core. The semiconductor nanoparticles having a core-shell structure can exhibit a further greater band edge emission.

The shell is a semiconductor material preferably essentially composed of Group 13 and Group 16 elements. Examples of Group 13 elements include B, Al, Ga, In, and Tl, and examples of Group 16 elements include O, S, Se, Te, and Po.

The shell may also be a semiconductor material essentially composed of Group 1, Group 13, and Group 16 elements. Containing a Group 1 element in addition to Group 13 and Group 16 elements tends to reduce defect emission. Examples of Group 1 element include Li, Na, K, Rb, and Cs, and Li, which has a closer ion radius to Al, is preferable.

Although the band gap energy of the core semiconductor varies in accordance with its composition, Group 11-Group 13-Group 16 ternary semiconductors typically have a band gap energy of from 1.0 eV to 3.5 eV. In particular, a semiconductor with a composition of Ag—In—Ga—S has a band gap energy of from 2.0 eV to 2.5 eV, and thus the shell may select, for example, its composition in accordance with the band gap energy of the core semiconductor. When, for example, the composition of the shell is predetermined, the core semiconductor may be designed to have a band gap energy smaller than the shell.

Specifically, the shell may have a band gap energy of, for example, from 2.0 eV to 5.0 eV, in particular from 2.5 eV to 5.0 eV. The shell may have a greater band gap energy than the core by, for example, from about 0.1 eV to about 3.0 eV, particularly, from about 0.3 eV to about 3.0 eV, and more particularly from about 0.5 eV to about 1.0 eV. When the difference in band gap energy between the shell and the core is small, the ratio of emission other than the band edge emission from the core can be greater, and this may reduce the ratio of the band edge emission.

The band gap energy of the core semiconductor and the band gap energy of the shell semiconductor are preferably selected to form a type-I band alignment where the core band gap energy exists between the shell band gap energy in heterojunction of the core and the shell. The type-I band alignment enables further satisfactory band edge emission from the core. In the type-I alignment, at least 0.1 eV barrier is preferably formed between the core band gap and the shell band gap, and, in particular, 0.2 eV or more, more particularly 0.3 eV or more barrier may be formed. The upper limit of the barrier is, for example, 1.8 eV or less, and particularly 1.1 eV or less. When the barrier is small, the ratio of emission other than the band edge emission from the core can be greater, and this can reduce the ratio of the band edge emission.

The shell may contain Ga, or a Group 13 element, and S, or a Group 16 element. The semiconductors containing Ga and S tend to have greater band gap energy than the Group 11-Group 13-Group 16 ternary semiconductors.

The shell semiconductor may have a crystal system in accord with the crystal system of the core semiconductor. Also, the shell semiconductor may have a lattice constant equal or close to the lattice constant of the core semiconductor. A shell formed from a semiconductor with a crystal system in accord with the crystal system of the core, and a lattice constant close to the core lattice constant (including its multiples close to the core lattice constant) may cover the periphery of the core appropriately. For example, the Group 11-Group 13-Group 16 ternary semiconductors typically have a tetragonal crystal system, and examples of the crystal system in accord with tetragonal crystal include tetragonal crystal, and orthorhombic crystal. An Ag—In—Ga—S semiconductor with a tetragonal crystal system has a lattice constant of 5.828 Å, 5.828 Å, or 11.19 Å. Preferably, the shell covering this core has a tetragonal crystal or cubic crystal system, and a lattice constant or its multiples close to the lattice constant of Ag—In—Ga—S. Or, the shell may be amorphous.

Whether an amorphous shell is formed can be checked by observing the core-shell semiconductor nanoparticles using a high-angle annular dark-field scanning transmission electron microscopy (HAADF-STEM). An HAADF-STEM shows an image with a regular pattern for a substance with a regular structure like a crystal substance, and an image with no regular pattern for a substance with no regular structure like an amorphous substance. Thus, an amorphous shell can be observed as an area clearly distinct from the core shown with an image of a regular pattern (with a crystal structure such as a tetragonal crystal system as described above).

When the core is formed from Ag—In—Ga—S and the shell is formed from GaS, the shell may be shown as a darker area than the core area in an image obtained through an HAADF-STEM because Ga is a lighter element than Ag and In.

Whether an amorphous shell is formed can also be checked by observing the core-shell structured semiconductor nanoparticles through a high-resolution transmission electron microscope (HRTEM). In the image obtained through an HRTEM, a crystal lattice image is observed for the core area (an image with a regular pattern), and the shell area is not observed as a crystal lattice image, but as an area of mere black and white contrast with no regular pattern.

When the shell is a semiconductor containing a combination of Ga and S, or a combination of Group 13 and Group 16 elements, the combination of Ga and S may take a form of gallium sulfide. The gallium sulfide forming the shell may not have a stoichiometric composition ($Ga_2S_3$). In this sense, gallium sulfide is herein represented by formula GaS (where x is not limited to an integer but any number, for example, from 0.8 to 1.5).

Gallium sulfide has band gap energy of from about 2.5 eV to about 2.6 eV, and gallium sulfide with a tetragonal crystal system has a lattice constant of 5.215 Å. However, the crystal system and others described above are all reported values, and actual core-shell semiconductor nanoparticles may not have a shell satisfying these values. Gallium sulfide, which has large band gap energy, is preferably used as a shell semiconductor. A gallium sulfide shell may exhibit a further strong band edge emission.

When the shell is a semiconductor containing a combination of Li, Ga, and S, or a combination of Group 1, Group 13, and Group 16 elements, the combination may take a form of, for example, gallium lithium sulfide. The gallium lithium sulfide may not have a stoichiometric composition (e.g., $LiGaS_2$). For example, the composition may be represented by $LiGaS_x$ (where x is not limited to an integer but any number, for example, from 1.1 to 2). Also, for example, the gallium sulfide may be amorphous where Li is solid-solubilized. The molar ratio of Li to Ga (Li/Ga) in the shell may be, for example, from 1/20 to 4, or from 1/10 to 2.

Gallium lithium sulfide has relatively large band gap energy of about 4 eV. This enables a further stronger band edge emission. Also, Li has about the same size of ion radius as Ag, which is contained in the core. Thus, for example, the shell can have a similar structure to the core. This is believed to compensate core surface defects, and further effectively suppress defect emission.

The core-shell semiconductor nanoparticles may have a shell surface modified with a surface modifier. Specific examples of the surface modifier include phosphorus-containing compounds having a negative oxidation number (hereinafter also referred to as "specific modifier") in addition to the nitrogen-containing compounds having a hydrocarbon group with a carbon number of from 4 to 20, the sulfur-containing compounds having a hydrocarbon group with a carbon number of from 4 to 20, and the oxygen-containing compounds having a hydrocarbon group with a carbon number of from 4 to 20 described above. With the shell surface modifier containing a specific modifier, the core-shell semiconductor nanoparticles may exhibit a band edge emission with an improved quantum yield.

The specific modifier contains P, or Group 15 element, having a negative oxidation number. The oxidation number of P becomes −1 when, for example, a hydrogen atom or an alkyl group binds to P, and becomes +1 when an oxygen atom binds through a single bond. The oxidation number of P varies depending on how P is substituted. For example, P in trialkyl phosphine and triaryl phosphine has an oxidation number of −3, and P in trialkyl phosphine oxide and triaryl phosphine oxide has an oxidation number of −1.

The specific modifier may contain, in addition to P with a negative oxidation number, other Group 15 elements. Examples of the other Group 15 elements include N, As, and Sb.

The specific modifier may be, for example, a phosphorus-containing compound having a hydrocarbon group with a carbon number of from 4 to 20. Examples of the hydrocarbon group with a carbon number of from 4 to 20 include a linear or branched saturated aliphatic hydrocarbon group, such as n-butyl, isobutyl, n-pentyl, n-hexyl, octyl, ethylhexyl, decyl, dodecyl, tetradecyl, hexadecyl, and octadecyl; a linear or branched unsaturated aliphatic hydrocarbon group, such as oleyl group; an alicyclic hydrocarbon group, such as cyclopentyl and cyclohexyl; an aromatic hydrocarbon group, such as phenyl and naphthyl; and an arylalkyl group, such as benzyl and naphthyl methyl. Of these, a saturated aliphatic hydrocarbon group or an unsaturated aliphatic hydrocarbon group is preferable. When the specific modifier has a plurality of hydrocarbon groups, they may be the same or different.

Examples of the specific modifier include tributylphosphine, triisobutylphosphine, triphenylphosphine, triphenylphosphine, trioctylphosphine, tris(ethylhexyl)phosphine, tridecylphosphine, tridodecylphosphine, tritetradecylphosphine, trihexadecylphosphine, trioctadecylphosphine, triphenylphosphine, tributylphosphine oxide, triisobutylphosphine oxide, triphenylphosphine oxide, trihexylphosphine oxide, trioctylphosphine oxide, tris(ethylhexyl)phosphine oxide, tridecylphosphine oxide, tridodecylphosphine oxide, tritetradecylphosphine oxide, trihexadecylphosphine oxide, trioctadecyl phosphine oxide, and triphenyl phosphine oxide, and at least one selected from the group consisting of these is preferable.

Method of Producing Core-Shell Semiconductor Nanoparticles

The method of producing core-shell semiconductor nanoparticles includes preparing a dispersion containing the semiconductor nanoparticles, adding semiconductor raw materials to the dispersion of the semiconductor nanoparticles, and forming a semiconductor layer on the surfaces of the semiconductor nanoparticles. To cover the semiconductor nanoparticles with a shell, the semiconductor nanoparticles is dispersed in an appropriate solvent to prepare a dispersion, and a semiconductor layer to become a shell is formed in the dispersion. In a dispersion where the semiconductor nanoparticles are dispersed, light is not scattered, so that the dispersion is generally transparent (colored or colorless). The solvent into which the semiconductor nanoparticles are dispersed can be any organic solvent (in particular, an organic solvent with high polarity, for example, an alcohol, such as ethanol) as in preparing the semiconductor nanoparticles, and the organic solvent can be a surface modifier or a solution containing a surface modifier. For example, the organic solvent can be a surface modifier described in relation to the method of producing the semiconductor nanoparticles, or specifically at least one selected from the nitrogen-containing compounds having a hydrocarbon group with a carbon number of from 4 to 20, or at least one selected from the sulfur-containing compounds having a hydrocarbon group with a carbon number of from 4 to 20, or a combination of at least one selected from the nitrogen-containing compounds having a hydrocarbon group with a carbon number of from 4 to 20 and at least one selected from the sulfur-containing compounds having a hydrocarbon group with a carbon number of from 4 to 20. Preferable specific examples of the nitrogen-containing compounds include n-tetradecylamine and oleylamine, because they have a boiling point exceeding 290° C., and are available with high purity. A specific example of the sulfur-containing compound is dodecanethiol. Specific examples of the organic solvent include oleylamine, n-tetradecylamine, dodecanethiol, and a combination of them.

The dispersion of the semiconductor nanoparticles may have a particle concentration in the dispersion adjusted to, for example, from $5.0 \times 10^{-7}$ mol/L to $5.0 \times 10^{-5}$ mol/L, in particular from $1.0 \times 10^{-6}$ mol/L to $1.0 \times 10^{-5}$ mol/L. With a too small ratio of the particles in the dispersion, the poor solvent makes it difficult to collect the product through aggregation and precipitation process. With a too large ratio, the rate of fusion of core materials increases through Ostwald ripening or collision, which tends to result in a broader particle diameter distribution.

Shell Formation

The shell semiconductor layer is formed, for example, by adding a Group 13 element-containing compound, and a Group 16 element in the form of a simple element or a Group 16 element-containing compound to the dispersion described above.

The Group 13 element-containing compound serves as a Group 13 element source, and examples include organic salts, inorganic salts, and organic metal compounds of Group 13 elements. Specific examples of Group 13 element-containing compounds include nitrate, acetate, sulfate, hydrochloride, sulfonate, and acetylacetonate complexes. Preferable examples include organic salts, such as acetate, or organic metal compounds, because organic salts and organic metal compounds are highly soluble in an organic solvent, and can allow the reaction to proceed further uniformly.

The Group 16 element in the form of a simple element or the Group 16 element-containing compound serves as a Group 16 element source. When, for example, sulfur (S), which is a Group 16 element, is used as a shell-forming element, sulfur in the form of a simple element such as high purity sulfur can be used, or a thiol, such as n-butanethiol, isobutanethiol, n-pentanethiol, n-hexanethiol, octanethiol, decanethiol, dodecanethiol, hexadecanethiol, or octadecanethiol; a disulfide, such as a dibenzyl sulfide; and a sulfur-containing compound, such as thiourea or a thiocarbonyl compound may be used.

When oxygen (O) is used as a Group 16 element for forming the shell, alcohol, ether, carboxylic acid, ketone, or a N-oxide compound may be used as the Group 16 element source. When selenium (Se) is used as a Group 16 element for forming the shell, selenium in the form of a simple element, or selenide phosphine oxide, or a compound such as an organic selenium compound (dibenzyl diselenide or diphenyl diselenide) or a hydride may be used as the Group 16 element source. When tellurium (Te) is used as a Group 16 element for forming the shell, tellurium in the form of a simple element, telluride phosphine oxide, or a hydride may be used as a Group 16 element source.

The method of adding Group 13 and the Group 16 element sources to the dispersion is not particularly limited. For example, the Group 13 and Group 16 element sources may be dispersed or dissolved in an organic solvent to prepare a mixed solution, and the mixed solution may be added portion-wise, for example, drop-wise to the dispersion. In this case, the mixed solution may be added at a rate of from 0.1 mL/h to 10 mL/h, in particular, from 1 mL/h to 5 mL/h. The mixed solution may be added to a heated dispersion. Specifically, for example, the temperature of the dispersion is raised to a peak temperature of from 200° C. to 310° C., and when the peak temperature is reached, the mixed solution is added portion-wise while the peak temperature is maintained, and then a shell layer is formed by allowing the temperature to decrease (slow injection method). The peak temperature may be maintained after the addition of the mixed solution as appropriate.

When the peak temperature is above the temperature described above, for example, the surface modifier modifying the semiconductor nanoparticles is fully removed, or a chemical reaction for forming the shell fully proceeds. Thus, the formation of a semiconductor layer (shell) tends to proceed in a satisfactory manner. When the peak temperature is less than the above-described temperature, changes in properties of the semiconductor nanoparticles tend to be reduced, and a good band edge emission tends to be exhibited. The time period during which the peak temperature is maintained can be from 1 min to 300 min, in particular from 10 min to 120 min in total from the starting of the addition of the mixed solution. The time period during which the peak temperature is maintained can be selected in relation to the peak temperature; the time period for a low peak temperature can be made longer, and the time period for a high peak temperature can be made shorter to form a good shell layer. The temperature-increase and decrease rates are not particularly limited. After the peak temperature is maintained for a predetermined time, the temperature may be decreased by, for example, stopping heating with a heating source (for example, an electric heater), and letting cool.

Alternatively, all the amounts of the Group 13 and Group 16 element sources may be directly added to the dispersion. The dispersion containing the Group 13 and Group 16 element sources may then be heated to form the shell semiconductor layer on the surfaces of the semiconductor nanoparticles (heating up method). Specifically, the temperature of the dispersion containing the Group 13 and Group 16 element sources is, for example, gradually increased to a peak temperature of from 200° C. to 310° C., maintained at the peak temperature for from 1 min to 300 min, and then allowed to gradually decrease. The rate at which the temperature is increased is, for example, from 1° C./min to 50° C./min, and the rate at which the temperature is decreased is, for example, from 1° C./min to 100° C./min. Or, the dispersion may be simply heated to reach a predetermined peak temperature without particularly controlling the rate at which the temperature is increased, and heating with a heating source may be stopped to allow cooling without particularly controlling the rate at which the temperature is decreased to a given rate. The advantage of the peak temperature being in the range above is as described in the method of adding the mixed solution (slow injection method).

The heating up method tends to produce core-shell semiconductor nanoparticles that exhibit a stronger band edge emission than the case where the shell is formed by the slow injection method.

Regardless of any of the methods used to add the Group 13 and Group 16 element sources, their initial ratio may be determined in accordance with the stoichiometric composition ratio of the compound semiconductor containing Group 13 and Group 16 elements, but their initial ratio may not necessarily follow the stoichiometric composition ratio. When the initial ratio is not in correspondence with the stoichiometric composition ratio, the raw materials may be used excessively than the target amount of product of the shell. Or, for example, the ratio of the Group 16 element source may be less than the stoichiometric composition ratio, or, for example, the initial ratio may be 1:1 (Group 13:Group 16). For example, when an In source is used as the Group 13 element source and an S source is used as the Group 16 element source, the initial ratio is preferably 1:1 instead of 1:1.5 (In:S), which corresponds to the composition formula: $In_2S_3$. Similarly, when a Ga source is used as the Group 13 element source and an S source is used as the Group 16 element source, the initial ratio is preferably 1:1 instead of 1:1.5 (Ga:S), which corresponds to the composition formula: $Ga_2S_3$.

To form a shell with a desired thickness on the semiconductor nanoparticles in the dispersion, the initial amount is selected taking the amount of the semiconductor nanoparticles in the dispersion into account. For example, the initial amounts of the Group 13 and the Group 16 element sources may be determined to produce 1 μmol to 10 mmol, in particular, from 5 μmol to 1 mmol of a compound semiconductor containing Group 13 and Group 16 elements with a stoichiometric composition relative to 10 nmol of the semiconductor nanoparticles in terms of an amount of substance as a particle; provided, however, that an amount of substance as a particle is a molar amount when a single particle is regarded as a huge molecule, which is equal to a value obtained by dividing the number of nanoparticles in the dispersion with Avogadro's number ($N_A = 6.022 \times 10^{23}$).

In the method of producing core-shell semiconductor nanoparticles, preferably, indium acetate or gallium acetylacetonate is used as a Group 13 element source, sulfur in the form of a simple element, thiourea, or dibenzyldisulfide is used as Group 16 element source, and a mixed solution of oleylamine and dodecanethiol is used as a dispersion to form a shell containing indium sulfide or gallium sulfide.

In the heating up method, when a mixed solution of oleylamine and dodecanethiol is used as a dispersion, the resulting core-shell semiconductor nanoparticles show an emission spectrum with a broad peak attributable to defect emission with an intensity satisfactory smaller than the peak intensity of the band edge emission. This tendency is also significantly recognized when gallium source is used as a Group 13 element source.

The shell is thus formed to complete core-shell semiconductor nanoparticles. The resultant core-shell semiconductor nanoparticles may be separated from the solvent, and may be further purified and dried as appropriate. The separation, purification and drying methods are as described in relation to the semiconductor nanoparticles, and thus the details will not be described.

When the shell semiconductor is essentially composed of Group 1, Group 13, and Group 16 elements, the shell can be formed in the same manner as described above. In other words, a Group 1 element-containing compound, a Group 13 element-containing compound, and a Group 16 element in the form of a simple element or a Group 16 element-containing compound are added to the dispersion containing the core-to-be semiconductor nanoparticles to form the shell.

Examples of the Group 1 element-containing compound include organic salts, inorganic salts, and organic metal compounds of Group 1 elements. Specific examples of the Group 1 element-containing compound include nitrate, acetate, sulfate, hydrochloride, sulfonate, and acetylacetonate complexes, and preferable examples include organic salts, such as acetate, or organic metal compounds, because organic salts and organic metal compounds are highly soluble in an organic solvent, and can allow the reaction to proceed further uniformly.

When the core-shell semiconductor nanoparticles have their shell surfaces modified with a specific modifier, the core-shell semiconductor nanoparticles obtained above may undergo a modification step. The modification step causes the core-shell semiconductor nanoparticles and a specific modifier containing phosphorus (P) with a negative oxidation number to come into contact with each other to modify the shell surfaces of the core shell particles. This produces semiconductor nanoparticles that exhibit a band edge emission with a further improved quantum yield.

The core-shell semiconductor nanoparticles and the specific modifier are contacted by, for example, mixing a dispersion of the core-shell semiconductor nanoparticles and the specific modifier. Or, the core shell particles may be mixed with a specific liquid modifier. The specific modifier may be used in the form of its solution. The dispersion of the core-shell semiconductor nanoparticles is obtained by mixing the core-shell semiconductor nanoparticles with an appropriate organic solvent. Examples of the organic solvent used for dispersion include halogen solvents, such as chloroform; aromatic hydrocarbon solvents, such as toluene; and aliphatic hydrocarbon solvents, such as cyclohexane, hexane, pentane, and octane. The concentration, in an amount of substance, of the core-shell semiconductor nanoparticles in the dispersion is, for example, from $1 \times 10^{-7}$ mol/L to $1 \times 10^{-3}$ mol/L, and preferably from $1 \times 10^{-6}$ mol/L to $1 \times 10^{-4}$ mol/L. An amount of substance as used herein has the same meaning as the one described in the shell formation.

The amount of the specific modifier to be used relative to the core-shell semiconductor nanoparticles is, for example, from 1 to 50,000 times in molar ratio. When the dispersion of the core-shell semiconductor nanoparticles has a concentration, in an amount of substance, of the core-shell semiconductor nanoparticles in the dispersion of from $1.0 \times 10^{-7}$ mol/L to $1.0 \times 10^{-3}$ mol/L, the dispersion and the specific modifier may be mixed in a volume ratio of from 1:1000 to 1000:1.

The temperature at which the core-shell semiconductor nanoparticles and the specific modifier come in contact is, for example, from −100° C. to 100° C. or from −30° C. to 75° C. The duration of contact may be selected as appropriate in accordance with, for example, the amount of use of the specific modifier or the concentration of the dispersion. The duration of contact is, for example, 1 min or more, preferably 1 h or more, and 100 h or less, preferably 48 h or less. The atmosphere of contact is, for example, an atmosphere of an inert gas, such as nitrogen gas or a rare gas.

Light-Emitting Device

The light-emitting device according to a third embodiment includes a light conversion member containing the semiconductor nanoparticles and/or the core-shell semiconductor nanoparticles, and a semiconductor light-emitting element. In this light-emitting device, for example, emission from the semiconductor light-emitting element is partially absorbed by the semiconductor nanoparticles and/or the core-shell semiconductor nanoparticles, and light with a further longer wavelength is emitted. The light from the semiconductor nanoparticles and/or the core-shell semiconductor nanoparticles and the residual light from the semiconductor light-emitting element are mixed, and the mixed light may be used as emission from the light-emitting device.

Specifically, using a semiconductor light-emitting element that emits bluish-violet light or blue light with a peak wavelength of from about 400 nm to about 490 nm, and the semiconductor nanoparticles and/or the core-shell semiconductor nanoparticles that absorb blue light and emit yellow light produces a light-emitting device that emit white light. Or, using two types of the semiconductor nanoparticles and/or the core-shell semiconductor nanoparticles: those that absorb blue light and emit green light and those that absorb blue light and emit red light may also produce a white light-emitting device.

Or, using a semiconductor light-emitting element that emits ultraviolet rays having a peak wavelength of 400 nm or less, and three types of the semiconductor nanoparticles and/or the core-shell semiconductor nanoparticles that absorb ultraviolet rays and emit blue light, green light, and red light, respectively, can also produce a white light-emitting device. In this case, ultraviolet rays emitted from the light-emitting element are preferably all absorbed by the semiconductor nanoparticles and/or the core-shell semiconductor nanoparticles to prevent their leakage outside.

The semiconductor nanoparticles and/or the core-shell semiconductor nanoparticles according to the present embodiment may be used in combination with other semiconductor quantum dots, or used in combination with other fluorescent materials (e.g., organic or inorganic fluorescent materials) that are not semiconductor quantum dots. The other semiconductor quantum dots are, for example, the binary semiconductor quantum dots described in the section of Description of the Related Art. Examples of the fluorescent materials that are not semiconductor quantum dots include garnet fluorescent materials such as aluminium garnet. Examples of the garnet fluorescent materials include cerium-activated yttrium.aluminium garnet fluorescent materials and cerium-activated lutetium-aluminium.garnet fluorescent materials. In addition, europium and/or chromium-activated nitrogen-containing alumino silicate calcium fluorescent materials, europium-activated silicate fluorescent materials; nitride fluorescent materials, such as β-SiAlON fluorescent materials, CASN or SCASN; rare-earth nitride fluorescent materials, such as $LnSi_3N11$ or LnSiAlON; oxynitride (e.g., $BaSi_2O_2N_2$:Eu or $Ba_3Si_6O_{12}N_2$:Eu-based) fluorescent materials; sulfide-based (e.g., CaS, $SrGa_2S_4$, $SrAl_2O_4$, and ZnS-based) fluorescent materials; chlorosilicate fluorescent materials; $SrLiAl_3N_4$:Eu fluorescent materials, $SrMg_3SiN_4$:Eu fluorescent materials; and manganese-activated fluoride complex fluorescent material, such as $K_2SiF_6$:Mn fluorescent materials may be used.

In the light-emitting device, a light conversion member including the semiconductor nanoparticles and/or the core-shell semiconductor nanoparticles may be, for example, a sheet or plate-like member, or 3-dimensional member. An example of the 3-dimensional member is a sealing member in a surface mount light emitting diode where a semiconductor light-emitting element is arranged on the bottom surface of a recess formed in the package, and resin is filled into the recess to form the sealing member to seal the semiconductor light-emitting element.

Another example of the light conversion member is found in the case where a semiconductor light-emitting element is disposed on a planar substrate. In this case, the light conversion member is a resin member formed in a manner to surround the top surface and the side surfaces of the semiconductor light-emitting element with a substantially uniform thickness. Still another example of the light conversion member is found in the case where a resin member containing a reflective material is filled around a semiconductor light-emitting element such that the top end of the resin member aligns with the semiconductor light-emitting element. In this case, the light conversion member is a plate-like resin member with a given thickness formed on top of the semiconductor light-emitting element and the resin member containing the reflective material.

The light conversion member may be arranged in contact with the semiconductor light-emitting element, or apart from the semiconductor light-emitting element. More specifically, the light conversion member may be a pellet member, a sheet member, a plate-like member, or a rod-like member arranged apart from the semiconductor light-emitting element, or a member arranged in contact with the semiconductor light-emitting element, for example, a sealing member, a coating member (a member separately formed from a mold member and covering the light-emitting element) or a mold member (for example, a lens-shaped member). When two or more types of the semiconductor nanoparticles or the core-shell semiconductor nanoparticles according to the present disclosure that emit light with different wavelengths are used, the two or more types of the semiconductor nanoparticles or the core-shell semiconductor nanoparticles according to the present disclosure may be mixed in a single light conversion member, or two or more light conversion members each containing only one type of quantum dots may be used in combination. In this case, the two or more light conversion members may have a layered structure, or arranged in dot or stripe patterns on a plane surface.

An example of the semiconductor light-emitting element includes an LED chip. The LED chip may include one, or two or more types of semiconductor layers selected from, for example, GaN, GaAs, InGaN, AlInGaP, GaP, SiC, and ZnO. The semiconductor light-emitting element that emits bluish-violet light, blue light, or ultraviolet rays preferably contains a GaN compound semiconductor layer having a composition represented by, for example, $In_XAl_YGa_{1-X-Y}N$ (where $0 \leq X$, $0 \leq Y$, and $X+Y<1$).

The light-emitting device is preferably incorporated into a liquid crystal display as a light source. The semiconductor nanoparticles and/or the core-shell semiconductor nanoparticles according to the present disclosure exhibit a band edge emission with a short emission lifetime. Thus, a light emitting device containing the semiconductor nanoparticles and/or the core-shell semiconductor nanoparticles is suitable as a light source for a liquid crystal display that needs a relatively quick response rate. Also, the semiconductor nanoparticles and/or the core-shell semiconductor nanoparticles according to the present disclosure can exhibit a band edge emission having an emission peak with a small half bandwidth.

Thus, without using a thick-color filter, a liquid crystal display with good color reproducibility can be obtained by including a light emitting device that includes:

a blue semiconductor light-emitting element that emits blue light with a peak wavelength in the range of from 420 nm to 490 nm, the semiconductor nanoparticles and/or the core-shell semiconductor nanoparticles according to the present disclosure that emit green light with a peak wavelength in the range of from 510 nm to 550 nm, and preferably in the range of from 530 nm to 540 nm, and the semiconductor nanoparticles and/or the core-shell semiconductor nanoparticles according to the present disclosure that emit red light with a peak wavelength in the range of from 600 nm to 680 nm, and preferably from 630 nm to 650 nm; or, a semiconductor light-emitting element that emits an ultraviolet light with a peak wavelength of 400 nm or less, and the semiconductor nanoparticles and/or the core-shell semiconductor nanoparticles according to the present disclosure that emit blue light with a peak wavelength in the range of from 430 nm to 470 nm, and preferably from 440 nm to 460 nm, the semiconductor nanoparticles according to the present disclosure that emit green light with a peak wavelength in the range of from 510 nm to 550 nm, and preferably from 530 nm to 540 nm, and the semiconductor nanoparticles and/or the core-shell semiconductor nanoparticles according to the present disclosure that emit red light with a peak wavelength in the range of from 600 nm to 680 nm, and preferably from 630 nm to 650 nm.

The light emitting device according to the present embodiment may be used, for example, as a direct backlight, or an edge backlight.

Alternatively, a light conversion member containing the semiconductor nanoparticles and/or the core-shell semiconductor nanoparticles according to the present disclosure may be incorporated into a liquid crystal display in the form of a sheet, a plate, or a rod formed from resin or glass independent of a light emitting device.

EXAMPLES

The present invention will now be described specifically with reference to Examples; however, the present invention is not limited to these Examples.

Example 1

0.1402 mmol of silver acetate (AgOAc), 0.1875 mmol of indium acetate (In(OAc)$_3$), 0.047 mmol of gallium acetate (Ga(OAc)$_3$), and 0.3744 mmol of thiourea, or a sulfur source, were charged and dispersed into a mixed solution of 0.05 cm$^3$ of 1-dodecanethiol and 2.95 cm$^3$ of oleylamine. The dispersion was then put into a test tube together with a stirrer, and the test tube was purged with nitrogen. The contents in the test tube were then subjected to a first heat-treating step at 150° C. for 10 min, and a second heat-treating step at 250° C. for 10 min while being stirred in the nitrogen atmosphere. After the heat-treatment, the resultant suspension was allowed to cool, and then centrifuged (radius 146 mm, 4000 rpm, 5 min) to collect the supernatant or the dispersion. To this, methanol was added until semiconductor nanoparticles started to precipitate, and the mixture was centrifuged (radius 146 mm, 4000 rpm, 5 min) to allow the semiconductor nanoparticles to precipitate. The precipitate was collected and dispersed in chloroform to obtain a semiconductor nanoparticle dispersion. Table 1 shows the initial composition of the raw materials.

Examples 2 and 3

A semiconductor nanoparticle dispersion was each obtained in the same manner as in Example 1 except that the initial compositions of the raw materials were changed as shown in Table 1.

TABLE 1

|  | AgOAc (mmol) | In(OAc)$_3$ (mmol) | Ga(OAc)$_3$ (mmol) | (NH$_2$)$_2$CS (mmol) |
|---|---|---|---|---|
| Example 1 | 0.1402 | 0.1875 | 0.0470 | 0.3744 |
| Example 2 | 0.0467 | 0.0625 | 0.0156 | 0.1250 |
| Example 3 | 0.0701 | 0.0938 | 0.0329 | 0.1997 |

Example 4

0.125 mmol of silver acetate (AgOAc), 0.0375 mmol of indium acetylacetonate (In(CH$_3$COCHCOCH$_3$)$_3$; In(AcAc)$_3$), 0.0875 mmol of gallium acetylacetonate (Ga(CH$_3$COCHCOCH$_3$)$_3$;Ga(AcAc)$_3$), and 0.25 mmol of sulfur, or a sulfur source, were charged and dispersed into a mixed solution of 0.25 cm$^3$ of 1-dodecanethiol and 2.75 cm$^3$ of oleylamine. The dispersion was put into a test tube together with a stirrer, and the test tube was purged with nitrogen. The contents in the test tube were heat-treated at 300° C. for 10 min while being stirred in the nitrogen atmosphere. After the heat-treatment, the same after-treatment as in Example 1 was carried out to obtain a semiconductor nanoparticle dispersion. Table 2 shows the initial composition of the raw materials.

Examples 5 to 8

A semiconductor nanoparticle dispersion was each obtained in the same manner as in Example 4 except that the initial composition of the raw materials and the heat treatment conditions were changed as shown in Table 2.

Example 9

Preparation of Core Semiconductor Nanoparticles
A core semiconductor nanoparticle dispersion was obtained in the same manner as above with the initial composition of the raw materials and the heat treatment conditions shown in Table 2.

Examples 10 and 11

Preparation of Core-Shell Semiconductor Nanoparticles
From the dispersion of the core semiconductor nanoparticles obtained in Example 9, 1.0×10$^{-5}$ mmol, which is an amount of substance of the nanoparticles (the number of particles), was weighed, and the solvent was allowed to evaporate in the test tube. 5.33×10$^{-5}$ mol of Ga(AcAc)$_3$ (19.3 mg) and of thiourea (2.75 mg) were dispersed in a mixed solvent of 2.75 mL of oleylamine and 0.25 mL of dodecanethiol to obtain a dispersion. The dispersion was stirred at 300° C. for 120 min in a nitrogen atmosphere. This was removed from the heating source, allowed to cool to normal temperature, and then centrifuged (radius 150 mm, 4000 rpm, 5 min) to separate the supernatant portion from the precipitate portion. Methanol was then added to each of them to obtain a precipitate of core-shell semiconductor nanoparticles. Each precipitate was centrifuged (radius 150 mm, 4000 rpm, 5 min) to collect a solid component. Ethanol was further added, and each mixture was centrifuged in the same manner. Those obtained from the supernatant portion and the precipitate portion were each dispersed in chloroform, and various measurements were carried out. The average particle diameter of the shell-coated particles was measured. The average particle diameter of the core shell particles obtained from the precipitate was 4.3 nm, and the average particle diameter of the particles obtained from the supernatant portion was 3.5 nm. The difference from the average particle diameter of the core semiconductor nanoparticles shows that the shell has a thickness in average of about 0.75 nm and 0.35 nm, respectively. The core-shell semiconductor nanoparticle dispersion obtained from the supernatant portion is hereinafter referred to as Example 10, and the core-shell semiconductor nanoparticle dispersion obtained from the precipitate portion is referred to as Example 11.

TABLE 2

|  | Heat treating temperature (° C.) | AgOAc (mmol) | In(AcAc)$_3$ (mmol) | Ga(AcAc)$_3$ (mmol) | S (mmol) |
| --- | --- | --- | --- | --- | --- |
| Example 4 | 300 | 0.125 | 0.0375 | 0.0875 | 0.25 |
| Example 5 | 280 | 0.125 | 0.0375 | 0.0875 | 0.25 |
| Example 6 | 250 | 0.2 | 0.08 | 0.12 | 0.4 |
| Example 7 | 250 | 0.1 | 0.04 | 0.06 | 0.2 |
| Example 8 | 280 | 0.1 | 0.04 | 0.06 | 0.2 |
| Example 9 | 300 | 0.125 | 0.0375 | 0.0875 | 0.25 |

Comparative Example 1

Silver acetate (AgOAc) and indium acetate (In(OAc)$_3$) were each weighed such that Ag/Ag+ In is 0.3 (Comparative Example 1), 0.4 (Comparative Example 3), and 0.5 (Comparative Example 2), and that the sum of the two metal salts was 0.25 mmol. The silver acetate (AgOAc), indium acetate (In(OAc)$_3$), and 0.25 mmol of thiourea were charged and dispersed in a mixed solution of 0.10 cm$^3$ of oleylamine and 2.90 cm$^3$ of 1-dodecanethiol. The dispersion was put into a test tube together with a stirrer, and the test tube was purged with nitrogen. The contents in the test tube were subjected to the first heat-treating step at 150° C. for 10 min, and then the second heat-treating step at 250° C. for 10 min while being stirred in the nitrogen atmosphere. After the heat-treatment, the resultant suspension was allowed to cool, and then centrifuged (radius 146 mm, 4000 rpm, 5 min) to precipitate semiconductor nanoparticles.

For Comparative Example 1, the resultant precipitate was washed with methanol, and to this, chloroform was added and centrifuged (radius 146 mm, 4000 rpm, 15 min). The supernatant was collected to obtain a semiconductor nanoparticle dispersion. For Comparative Examples 2 and 3, methanol was added until nanoparticles stated to precipitate in the dispersion, or the supernatant, and centrifuged (radius 146 mm, 4000 rpm, 5 min) to precipitate semiconductor nanoparticles. Each precipitate was taken out, and dispersed in chloroform to obtain a semiconductor nanoparticle dispersion.

Composition Analysis

The resultant respective semiconductor nanoparticles were subjected to an X-ray fluorescence analyzer to determine the ratio of Ag, In, Ga, and S atoms contained in the semiconductor nanoparticles when all the number of atoms were 100, and then Ga ratio calculated by Ga/(Ga+ In), Ag ratio calculated by Ag/(Ag+ In+Ga), and S ratio calculated by S/(Ag+ In+Ga) were determined. Table 3 shows the results.

Average Particle Diameter

The shapes of the resultant semiconductor nanoparticles were observed, and their average particle diameters were measured. The resultant particles were spherical or polygonal. Table 3 shows the average particle diameters.

Light Emission Properties

Figure 1:
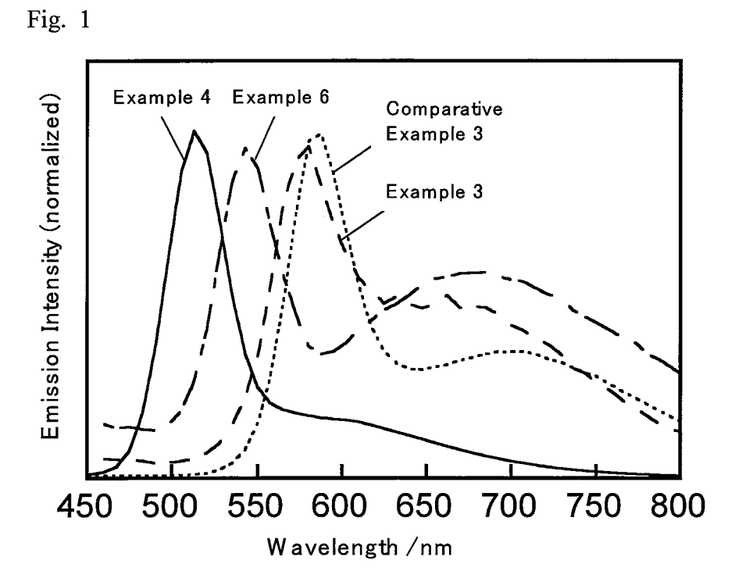
FIG. 1 is a graph showing emission spectra of semiconductor nanoparticles.
Figure 2:
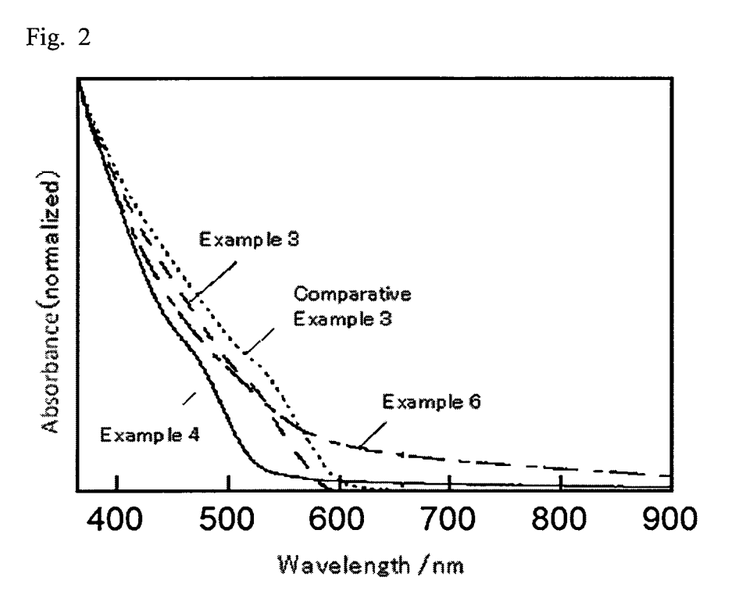
FIG. 2 is a graph showing absorption spectra of semiconductor nanoparticles.
Figure 4:
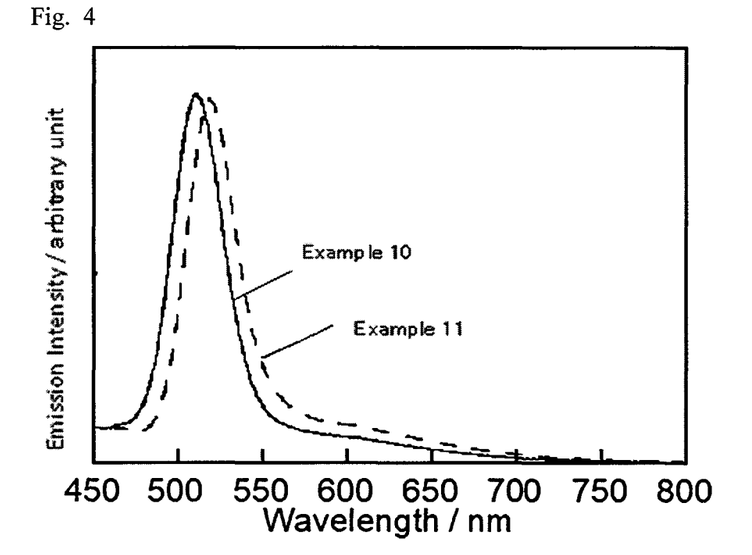
FIG. 4 is a graph showing emission spectra of semiconductor nanoparticles.
Figure 5:
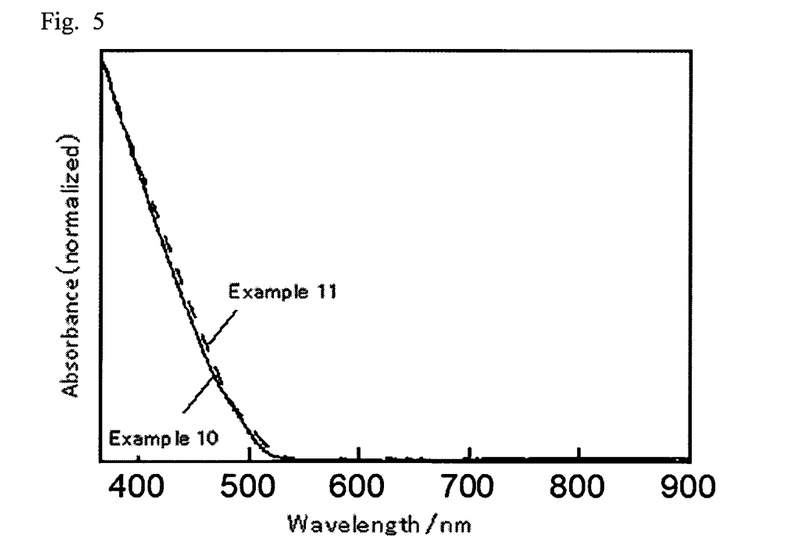
FIG. 5 is a graph showing absorption spectra of semiconductor nanoparticles.

For the respective semiconductor nanoparticles, the absorption spectrum and the emission spectrum were each measured. The absorption spectrum in the wavelength range of 190 nm to 1100 nm was measured using a diode array spectrophotometer (trade name: Agilent 8453A by Agilent Technologies). The emission spectrum was measured at an excitation wavelength of 365 nm using a multichannel photodetector (trade name: PMA11 by Hamamatsu Photonics). FIG. 1 shows the emission spectra of Examples 3, 4, and 6, and Comparative Example 3, and FIG. 2 shows their absorption spectra. FIG. 4 shows the emission spectra of Examples 10 and 11, and FIG. 5 shows their absorption spectra. Table 3 shows the peak emission wavelength of the sharp emission peak (band edge emission) and the half bandwidth observed in each emission spectrum. Also, the ratio of the band edge emission intensity to the peak emission intensity of donor-acceptor pair (DAP) transition (Band edge/DAP) was determined.

X-Ray Analysis Pattern

Figure 3:
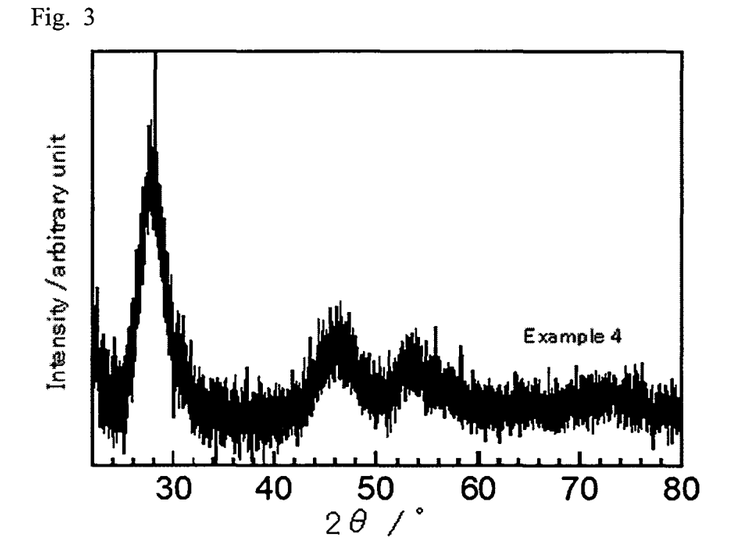
FIG. 3 is a graph showing an XRD pattern of semiconductor nanoparticles according to Example 4.

For the semiconductor nanoparticles obtained in Example 4, the X-ray analysis (XRD) pattern was determined, and compared with tetragonal crystal (chalcopyrite) AgInS$_2$ and orthorhombic crystal AgInS$_2$. FIG. 3 shows the determined XRD pattern. The XRD pattern shows that the semiconductor nanoparticles of Example 4 have about the same crystal structure as the tetragonal crystal AgInS$_2$. The XRD pattern was determined using a powder X-ray diffractometer (trade name: SmartLab by Rigaku.

TABLE 3

|  | Ag/(Ag + Ga + h) | Ga/(In + Ga) | S/(Ag + Ga + In) | Average particle diameter (nm) | Band edge emission wavelength (nm) | Half bandwidth (nm) | Band edge/DAP | DAP transition emission wavelength (nm) |
| --- | --- | --- | --- | --- | --- | --- | --- | --- |
| Example 1 | 0.12 | 0.58 | 0.76 | <10 | 580 | 57 | 2.538 | 685 |
| Example 2 | 0.27 | 0.29 | 1.14 | 3.9 | 580 | 42 | 3.674 | 690 |
| Example 3 | 0.07 | 0.71 | 0.66 | <10 | 575 | 48 | 1.97 | 680 |
| Example 4 | 0.50 | 0.63 | 1.32 | 2.8 | 514 | 44 | 5.93 | 600 |
| Example 5 | 0.46 | 0.65 | 1.27 | <10 | 511 | 46 | 2.482 | 607 |
| Example 6 | 0.36 | 0.85 | 0.84 | <10 | 540 | 48 | 1.615 | 680 |
| Example 7 | 0.49 | 0.52 | 1.51 | <10 | 513 | 48 | 1.561 | 609 |
| Example 8 | 0.51 | 0.53 | 1.37 | <10 | 519 | 55 | 1.403 | 638 |
| Example 9 | 0.48 | 0.65 | 1.28 | <10 | 512 | 45 | 1.56 | 611 |
| Example 10 | 0.42 | 0.72 | 1.41 | 3.5 | 510 | 38 | 14.7 | 600 |
| Example 11 | 0.42 | 0.73 | 1.34 | 4.3 | 520 | 38 | 9.9 | 600 |
| Comparative Example 1 | 0.43 | — | 1.24 | 10.4 | — | 212 | — | 810 |
| Comparative Example 2 | 0.49 | — | 1.23 | 3.8 | — | 172 | — | 750 |

TABLE 3-continued

|  | Ag/ (Ag + Ga + h) | Ga/ (In + Ga) | S/ (Ag + Ga + In) | Average particle diameter (nm) | Band edge emission wavelength (nm) | Half bandwidth (nm) | Band edge/ DAP | DAP transition emission wavelength (nm) |
|---|---|---|---|---|---|---|---|---|
| Comparative Example 3 | 0.37 | — | 1.34 | 4.3 | 590 | 47 | — | 710 |

Table 3 shows that the semiconductor nanoparticles of the present embodiments exhibit a band edge emission having a peak emission wavelength at shorter emission wavelengths than Comparative Example 3. The results of Examples 10 and 11 show that the semiconductor nanoparticles having a smaller average particle diameter exhibit a band edge emission with a shorter emission wavelength even when they are produced by the same method of producing semiconductor nanoparticles.

Example 12

0.0833 mmol of silver acetate (AgOAc), 0.050 mmol of In(AcAc)$_3$, 0.075 mmol of Ga(AcAc)$_3$, and 0.229 mmol of sulfur, or a sulfur source, were charged and dispersed into a mixed solution of 0.25 cm$^3$ of 1-dodecanethiol and 2.75 cm$^3$ of oleylamine. The dispersion was then put into a test tube together with a stirrer, and the test tube was purged with nitrogen. The contents in the test tube were then heat-treated at 300° C. for 10 min while being stirred in the nitrogen atmosphere. After the heat-treatment, the resultant suspension was allowed to cool, and then centrifuged (radius 146 mm, 4000 rpm, 5 min) to collect the supernatant or the dispersion. To this, methanol was added until semiconductor nanoparticles started to precipitate, and the mixture was centrifuged (radius 146 mm, 4000 rpm, 5 min) to precipitate the semiconductor nanoparticles. The precipitate was collected and dispersed in chloroform to obtain a semiconductor nanoparticle dispersion.

Preparation of Core-Shell Semiconductor Nanoparticles

From the core semiconductor nanoparticle dispersion obtained above, 1.0×10$^{-5}$ mmol, which is an amount of substance of the nanoparticles (the number of particles), was weighed, and the solvent was allowed to evaporate in the test tube. To this, 5.33×10$^{-5}$ mol of Ga (AcAc)$_3$ (19.3 mg), 5.33×10$^{-5}$ mol of thiourea (2.75 mg), and 2.67×10$^{-5}$ mol of lithium acetate, and 3.0 mL of oleylamine were mixed and dispersed to obtain a dispersion. The molar ratio of Li to Ga (Li/Ga) in the dispersion was ½. The dispersion was then stirred at 300° C. for 15 min in a nitrogen atmosphere. This was removed from the heating source, allowed to cool to normal temperature, and then centrifuged (radius 150 mm, 4000 rpm, 5 min) to separate the supernatant portion from the precipitate portion. Methanol was then added to the supernatant portion to obtain a precipitate of core-shell semiconductor nanoparticles. The precipitate was centrifuged (radius 150 mm, 4000 rpm, 5 min) to collect a solid component. Ethanol was further added, and the mixture was centrifuged in the same manner. The supernatant portion and the precipitate portion were each dispersed in chloroform, and various measurements were carried out. The average particle diameter of the shell-coated particles was measured to be 4.7 nm. The difference from the average particle diameter of the core semiconductor nanoparticles shows that the shell each has a thickness in average of about 0.75 nm.

Figure 6:
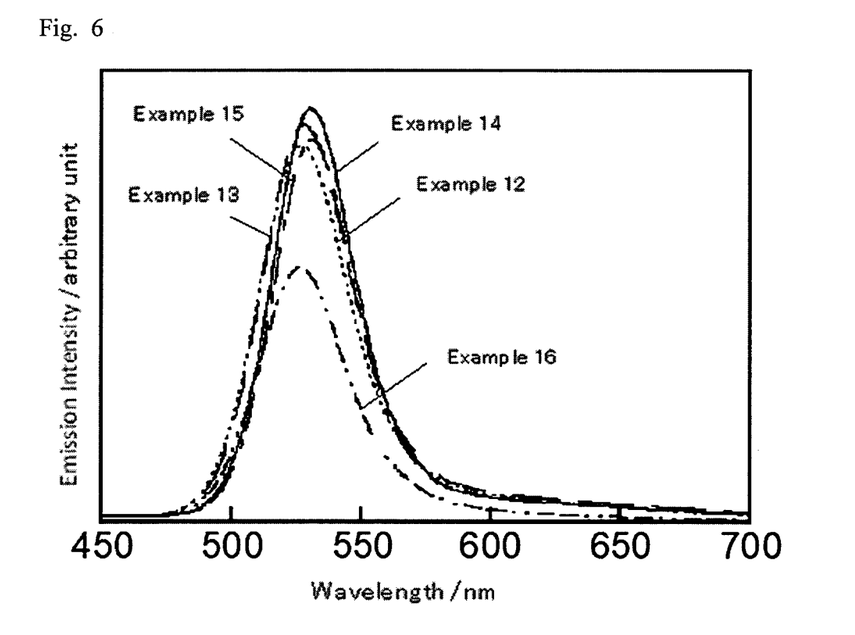
FIG. 6 is a graph showing emission spectra of core-shell semiconductor nanoparticles according to Examples 12 to 16.

For the resultant core-shell semiconductor nanoparticles, the composition analysis and determination of the emission spectrum were carried out in the same manner as described above. Table 4 shows the evaluation results, and FIG. 6 shows its emission spectrum.

Examples 13 to 16

Core-shell semiconductor nanoparticles were prepared in the same manner as in Example 12, with the amounts of Ga(AcAc)$_3$ and thiourea fixed to 5.33×10$^{-5}$ mol, except that the molar ratio of Li to Ga (Li/Ga) in the dispersion was changed by changing the amount of addition of lithium acetate. Table 4 shows the evaluation results, and FIG. 6 shows their emission spectra.

Examples 17 and 18

Figure 7:
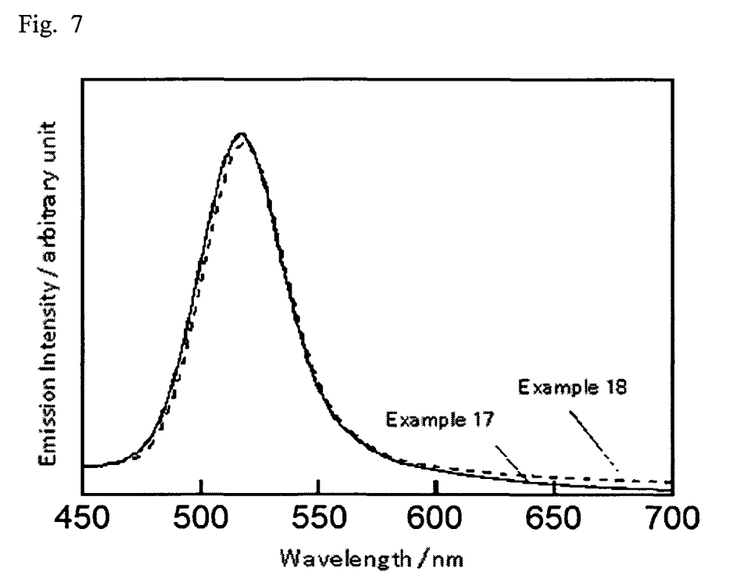
FIG. 7 is a graph showing emission spectra of core-shell semiconductor nanoparticles according to Examples 17 and 18.

Core-shell semiconductor nanoparticles were prepared in the same manner as in Example 12, with the amounts of Ga(AcAc)$_3$ and thiourea fixed to 5.33×10$^{-5}$ mol, except that the molar ratio of Li to Ga (Li/Ga) in the dispersion was changed by changing the amount of addition of Ga(AcAc)$_3$ as shown in the table below. Table 4 shows the evaluation results, and FIG. 7 shows their emission spectra.

TABLE 4

|  | Li/Ga | Ag/ (Ag + Ga + In) | Ga/ (In + Ga) | S/ (Ag + Ga + In) | Average particle diameter (nm) | Band edge emission wavelength (nm) | Half bandwidth (nm) | Band edge/ DAP |
|---|---|---|---|---|---|---|---|---|
| Example 13 | 1/10 | 0.31 | 0.74 | 1.25 | 4.0 | 530 | 35 | 24.286 |
| Example 14 | 1/8 | 0.30 | 0.74 | 1.23 | 4.2 | 530 | 36 | 25.857 |
| Example 15 | 1/4 | 0.25 | 0.73 | 1.20 | 3.2 | 530 | 38 | 23.375 |
| Example 12 | 1/2 | 0.31 | 0.80 | 1.08 | 4.7 | 528 | 40 | 21.875 |
| Example 16 | 1/1 | 0.29 | 0.75 | 1.26 | 3.2 | 525 | 36 | 39.333 |
| Example 17 | 2/1 | 0.35 | 0.70 | 1.18 | 5.2 | 517 | 42 | 21.000 |
| Example 18 | 3/2 | 0.33 | 0.74 | 1.13 | 5.1 | 517 | 42 | 21.750 |

Containing Li, or a Group 1 element, in the shell reduces DAP emission, or defect emission, and improves the intensity of the band edge emission. With Ga greater than Li, the band edge emission wavelength shifts to shorter wavelengths.

Example 19

To the dispersion of the core-shell semiconductor nanoparticles obtained in Example 12, an approximately the same volume of trioctylphosphine (TOP) was added in a nitrogen atmosphere. This was stirred at room temperature for 10 min, and then left standing at room temperature for 20 h while being protected from light to obtain a dispersion of TOP-modified core-shell semiconductor nanoparticles.

Figure 8:
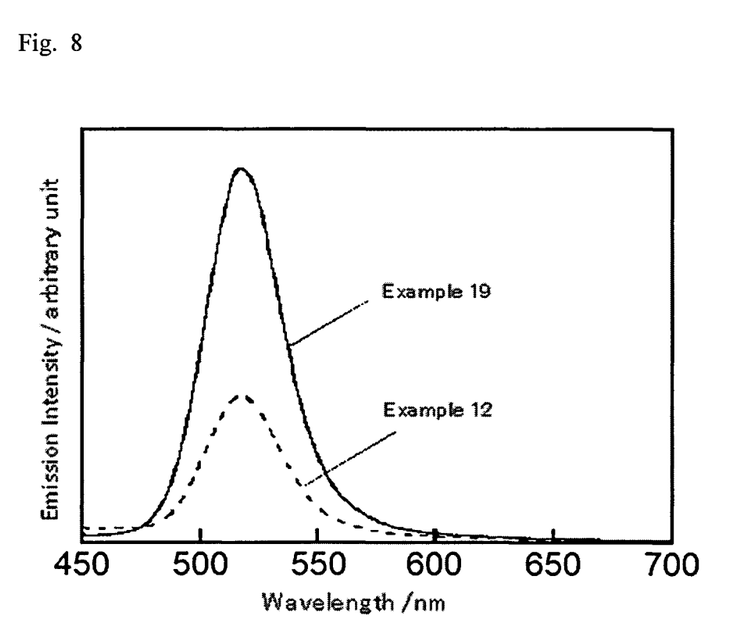
FIG. 8 is a graph showing an emission spectrum of TOP-modified core-shell semiconductor nanoparticles according to Example 19.

For the resultant TOP-modified core-shell semiconductor nanoparticles, the emission spectrum was measured in the same manner as described above, and the internal quantum yield was also measured. The core-shell semiconductor nanoparticles had an internal quantum yield of 13.5%, whereas the TOP-modified core-shell semiconductor nanoparticles had an internal quantum yield of 31.4%. FIG. 8 shows the emission spectrum.

The disclosures of Japanese Patent Applications No. 2017-037477 (filed: Feb. 28, 2017) and No. 2018-025251 (filed: Feb. 15, 2018) are incorporated herein in their entireties by reference. The literature, patent applications, and technical standards described herein are incorporated herein by reference to the same extent as each of them is specifically and individually described as being incorporated herein.

What is claimed is:

1. Semiconductor nanoparticles, comprising:
Ag, In, Ga, and S,
wherein a ratio of a number of Ga atoms to a total number of In and Ga atoms is 0.95 or less,
wherein the semiconductor nanoparticles emit light having an emission peak with a wavelength in a range of from 500 nm to less than 590 nm, and a half bandwidth of 70 nm or less, and
wherein the semiconductor nanoparticles have an average particle diameter of 10 nm or less.

2. The semiconductor nanoparticles according to claim 1, wherein the ratio of the number of Ga atoms to the total number of In and Ga atoms is from 0.2 to 0.9.

3. The semiconductor nanoparticles according to claim 2, wherein a ratio of a number of Ag atoms to a total number of Ag, In, and Ga atoms is from 0.05 to 0.55.

4. The semiconductor nanoparticles according to claim 3, wherein the ratio of the number of Ag atoms to the total number of Ag, In, and Ga atoms is from 0.3 to 0.55, and the ratio of the number of Ga atoms to the total number of In and Ga atoms is from 0.5 to 0.9.

5. The semiconductor nanoparticles according to claim 3, wherein the ratio of the number of Ag atoms to the total number of Ag, In, and Ga atoms is from 0.05 to 0.27, and the ratio of the number of Ga atoms to the total number of In and Ga atoms is from 0.25 to 0.75.

6. The semiconductor nanoparticles according to claim 1, wherein a ratio of a number of Ag atoms to a total number of Ag, In, and Ga atoms is from 0.05 to 0.55.

7. Core-shell semiconductor nanoparticles, comprising:
a core containing the semiconductor nanoparticles according to claim 1; and
a shell containing a semiconductor material essentially composed of a Group 13 element and a Group 16 element and arranged on a surface of the core, and
wherein the core-shell semiconductor nanoparticles emit light upon irradiation of light.

8. The semiconductor nanoparticles according to claim 7, wherein the Group 13 element contained in the shell is Ga.

9. The semiconductor nanoparticles according to claim 7, wherein the
Group 16 element contained in the shell is S.

10. The semiconductor nanoparticles according to claim 7, wherein a
compound containing a Group 15 element that contains at least P with a negative oxidation number is arranged on a surface of the shell.

11. Core-shell semiconductor nanoparticles, comprising:
a core containing the semiconductor nanoparticles according to claim 1; and
a shell containing a semiconductor material essentially composed of a Group 1 element, a Group 13 element, and a Group 16 element and arranged on a surface of the core, and
wherein the core-shell semiconductor nanoparticles emit light upon irradiation of light.

12. The semiconductor nanoparticles according to claim 11, wherein a
compound containing a Group 15 element that contains at least P with a negative oxidation number is arranged on a surface of the shell.

13. A light-emitting device, comprising:
a light conversion member containing the semiconductor nanoparticles according to claim 1; and
a semiconductor light-emitting element.

14. The light-emitting device according to claim 13, wherein the semiconductor light-emitting element is an LED chip.

15. A method of producing semiconductor nanoparticles, the method comprising:
preparing a mixture containing silver acetate, indium acetylacetonate, gallium acetylacetonate, a sulfur source, and an organic solvent; and
heat-treating the mixture.

16. The method according to claim 15, wherein the mixture is heat-treated at a temperature of from 290° C. to 310° C. for 5 min or more.

17. The method according to claim 15, wherein the organic solvent contains at least one thiol selected from thiols having a hydrocarbon group with a carbon number of from 4 to 20, and at least one amine selected from amines having a hydrocarbon group with a carbon number of from 4 to 20.

18. The method according to claim 15, wherein the sulfur source is a simple substance of sulfur.

* * * * *

UNITED STATES PATENT AND TRADEMARK OFFICE
CERTIFICATE OF CORRECTION

Page 1 of 1

PATENT NO. : 11,101,413 B2
APPLICATION NO. : 16/489214
DATED : August 24, 2021
INVENTOR(S) : Tsukasa Torimoto et al.

It is certified that error appears in the above-identified patent and that said Letters Patent is hereby corrected as shown below:

On the Title Page

In the Inventors section, please list the address of 8th inventor Kenta Niki as follows:
--Tokushima (JP)--

Signed and Sealed this
Ninth Day of November, 2021

Drew Hirshfeld
*Performing the Functions and Duties of the*
*Under Secretary of Commerce for Intellectual Property and*
*Director of the United States Patent and Trademark Office*